United States Patent [19]

Hongu et al.

[11] 3,906,386

[45] Sept. 16, 1975

[54] TRANSISTOR AMPLIFIER CIRCUITS WITH STABILIZED LOW CURRENT BIASING

[75] Inventors: Masayuki Hongu, Komae; Isamu Ikeda, Yokohama, both of Japan

[73] Assignee: Sony Corporation, Tokyo, Japan

[22] Filed: May 23, 1973

[21] Appl. No.: 363,171

[30] Foreign Application Priority Data

June 5, 1972 Japan ................................ 47-55901

[52] U.S. Cl. ....................... 330/22; 330/19; 330/23; 330/32; 330/40

[51] Int. Cl.² ............................................ H03F 3/04

[58] Field of Search .......... 307/310; 330/19, 22, 23, 330/38 M, 40, 32

[56] References Cited

UNITED STATES PATENTS

| | | | |
|---|---|---|---|
| 2,844,667 | 7/1958 | Yaeger | 330/32 X |
| 2,858,379 | 10/1958 | Stanley | 330/32 X |
| 2,892,165 | 6/1959 | Lindsay | 330/23 X |

*Primary Examiner*—R. V. Rolinec
*Assistant Examiner*—Lawrence J. Dahl
*Attorney, Agent, or Firm*—Hill, Gross, Simpson, Van Santen, Steadman, Chiara & Simpson

[57] ABSTRACT

A transistor amplifying circuit having an amplifying transistor, a biasing transistor and an emitter follower transistor. The emitter follower is interposed between the signal source and the amplifying transistor to increase the input impedance of the circuit. Temperature compensating means are provided, and in one embodiment, a current sink is provided to increase the efficiency of supplying an input signal to the amplifying transistor.

4 Claims, 5 Drawing Figures

TRANSISTOR AMPLIFIER CIRCUITS WITH STABILIZED LOW CURRENT BIASING

BACKGROUND OF THE INVENTION

1. Field of the Invention

The field of art to which this invention pertains is transistor amplifier circuits with stabilized low current biasing and in particular, to such circuits having a high impedance input.

2. Description of the Prior Art

In a prior art device shown in FIG. 1, an amplifier transistor $Q_2$ and biasing transistor $Q_1$ are formed on a common semiconductor substrate, so that both transistors have the same current gain ($\beta$) and base-emitter voltage ($V_{BE}$).

The quiescent collector current of the biasing transistor $Q_1$ ($I_1$) is equal to the quiescent collector current of the amplifier transistor $Q_2$ ($I_2$) because resistance values $R_1$ and $R_2$ are selected equal. $I_1$ and $I_2$ are substantially not affected by changes in the transistor's characteristics, namely, changes in $V_{BE}$, due to temperature variations which are common to both transistors. Consequently, stabilized biasing of the amplifier transistor $Q_2$ is obtained. The following equations show this to be true:

$R_1 = R_2$
$\beta$ = Current gain of $Q_1$ and $Q_2$ ($\beta >> 1$)
$V_{BE}$ = Base-Emitter voltage of $Q_1$ and $Q_2$ $$VCC = R_{L1}\left(I_1 + \frac{I_1}{\beta} + \frac{I_2}{\beta}\right) + R_1\cdot\frac{I_1}{\beta} + V_{BE} \quad (1)$$

$$VCC = R_{L1}\left(I_1 + \frac{I_1}{\beta} + \frac{I_2}{\beta}\right) + R_2\cdot\frac{I_1}{\beta} + V_{BE} \quad (2)$$

$$(1)-(2) \quad R_1\cdot\frac{I_1}{\beta} = R_2\cdot\frac{I_2}{\beta}$$

where $R_1$ is equal to $R_2$, therefore, $$I_1 = I_2 \quad (3)$$

By substituting $I_2$ for $I_1$, Expression (1) becomes as follows:

$$VCC = R_{L1}\cdot\left(I_1 + \frac{I_1}{\beta} + \frac{I_1}{\beta}\right) + R_1\cdot\frac{I_1}{\beta} + V_{BE}$$

$$VCC - V_{BE} = R_{L1}\cdot I_1 + (2R_{L1} + R_1)\cdot\frac{I_1}{\beta}$$

$$I_1 = \frac{V_{CC} - V_{BE}}{R_{L1}} - \left(\frac{2R_{L1} + R_1}{R_{L1}}\right)\cdot\frac{I_1}{\beta}$$

therefore, for $$V_{CC} >> V_{BE}$$

and $$\left(\frac{2R_{L1} + R_1}{R_{L1}}\right)\cdot\frac{I_1}{\beta} << I_1$$

$$I_1 \doteqdot \frac{V_{CC}}{R_{L1}} \quad (3a)$$

Equation (3$a$) shows that I, is independent of $V_{BE}$.

Since the collector current $I_1$ of the biasing transistor $Q_1$ has a value equal to the collector current $I_2$ of the amplifier transistor $Q_2$, the power dissipation incurred in the biasing portion will be comparable to that incurred in the amplifier portion. The amplifier of this type usually serves as a high current output stage of a signal channel and therefore this power dissipation in the biasing portion is undesirable.

In an improved prior art device shown in FIG. 2, quiescent collector current $I_1$ of biasing transistor $Q_1$ is $1/K_1$ times smaller than quiescent collector current $I_2$ of amplifier transistor $Q_2$. $K_1$ is larger than 1 and determined by a ratio between resistance values $R_1$ and $R_2$. This ratio is equal to the ratio between resistance values $R_3$ and $R_4$. Therefore, undesired power dissipation incurred in the biasing portion is less than the circuit of Prior Art 1. Further, the collector current $I_1$ of the biasing transistor $Q_1$ is substantially not affected by changes in the transistor characteristic due to temperature variations, so the biasing of the amplifier transistor $Q_2$ is stabilized. The following equations show this to be true:

$$\begin{cases} \dfrac{R_1}{R_2} = \dfrac{R_3}{R_4} = K_1 > 1 \\[2ex] \dfrac{R_2}{R_4} = \dfrac{R_1}{R_3} = K_2 > 1 \end{cases}$$

$\beta$ = current gain of $Q_1$ and $Q_2$ ($\beta >> 1$)

$$V_{CC} = R_{L1}\cdot\left(I_1 + \frac{I_1}{\beta} + \frac{I_2}{\beta}\right) + R_1\cdot\frac{I_1}{\beta} + V_{BE} + R_3\cdot\left(I_1 + \frac{I_1}{\beta}\right) \quad (4)$$

$$V_{CC} = R_{L1}\cdot\left(I_1 + \frac{I_1}{\beta} + \frac{I_2}{\beta}\right) + R_2\cdot\frac{I_2}{\beta} + V_{BE} + R_4\cdot\left(I_2 + \frac{I_2}{\beta}\right) \quad (5)$$

(4) − (5)

$$R_1\cdot\frac{I_1}{\beta} + R_3\cdot\left(I_1 + \frac{I_1}{\beta}\right) = R_2\cdot\frac{I_2}{\beta} + R_4\cdot\left(I_2 + \frac{I_2}{\beta}\right)$$

$$\frac{I_2}{I_1} = \frac{R_1 + R_3(1+\beta)}{R_2 + R_4(1+\beta)}$$

$$= \frac{R_3}{R_4}\cdot\frac{\dfrac{R_1}{R_3} + (1+\beta)}{\dfrac{R_2}{R_4} + (1+\beta)}$$

where $$\frac{R_3}{R_4} = K_1$$

and $$\frac{R_1}{R_3} = \frac{R_2}{R_4} = K_2,$$

therefore, $$\frac{I_2}{I_1} = K_1$$

$$I_1 = \frac{1}{K_1} \cdot I_2 \qquad (6)$$

By substituting $I_2$ for $K_1 \cdot I_1$, expression (4) becomes as follows:

$$V_{CC} = R_{L1} \cdot \left( I_1 + \frac{I_1}{\beta} + \frac{K_1}{\beta} \cdot I_1 \right) + R_1 \cdot \frac{I_1}{\beta} + V_{BE} + R_3 + I_1 \left( \frac{I_1}{\beta} \right)$$

$$V_{CC} - V_{BE} = \left\{ R_{L1} \cdot \left( 1 + \frac{1}{\beta} + \frac{K_1}{\beta} \right) + R_3 \cdot \left( 1 + \frac{1}{\beta} \right) \right\} \cdot I_1 + R_1 \cdot \frac{I_1}{\beta}$$

where $\beta >> 1$, $K_1$, therefore, $$V_{CC} - V_{BE} = (R_{L1} + R_3) \cdot I_1 + R_1 \cdot \frac{I_1}{\beta}$$

$$I_1 \approx \frac{V_{CC} - V_{BE}}{R_{L1} + R_3} + \frac{R_1}{R_{L1} + R_3} \cdot \frac{I_1}{\beta}$$

further, for $V_{CC} >> V_{BE}$ and $$\frac{R_1}{R_{L1} + R_3} \cdot \frac{I_1}{\beta} << I_1$$

$$I_1 \doteqdot \frac{V_{CC}}{R_{L1} + R_3} \qquad (6a)$$

Equation (6) shows that $I_1$ equals a constant times $I_2$, and equation (6*a*) shows that $I_1$ and hence $I_2$ are independent of $V_{BE}$.

It should be understood that the resistance value $R_4$ may be relatively small so as to maintain the high gain of the amplifier which includes the transistor $Q_2$. The reason for this is that the gain of a transistor amplifier of the collector follower type is substantially proportioned to the ratio between the collector resistance (R*c*) and emitter resistance (R*e*) of the transistor, namely R*c*/R*e*. Accordingly, increased emitter resistance tends to reduce the gain of the amplifier. The small emitter resistance value $R_4$, however, provides a low input impedance of the amplifier transistor $Q_2$. This results in a disadvantage that a signal circuit connected to the input of the amplifier transistor $Q_2$ is required to have a low output impedance. Generally, it is a severe requirement for circuits in actual use to provide such a predetermined low output impedance.

SUMMARY OF THE INVENTION

It is an important object of the present invention to provide an improved transistor amplifier circuit with stabilized low current biasing.

It is another object of the present invention to provide such an amplifier circuit which has a substantially high input impedance.

It is a further object of the invention to provide a circuit as described above wherein means are provided to increase the input impedance and further means are included to compensate for current variations due to temperature changes surrounding the high input impedance means.

It is also an object of the present invention to provide a combination of an emitter follower transistor and a current sink to assure greater efficiency of supplying the input signal to the amplifier.

These and other objects of the invention will become understood from the following description and the associated drawings wherein reference characters are used to designate a preferred embodiment.

DESCRIPTION OF THE PREFERRED EMBODIMENTS

This invention relates generally to transistor circuits composed of a plurality of transistors on a common semiconductor chip, and more particularly, to a transistor amplifier operable with a stabilized low current biasing provided by a biasing portion of the integrated circuit.

Figure 1:
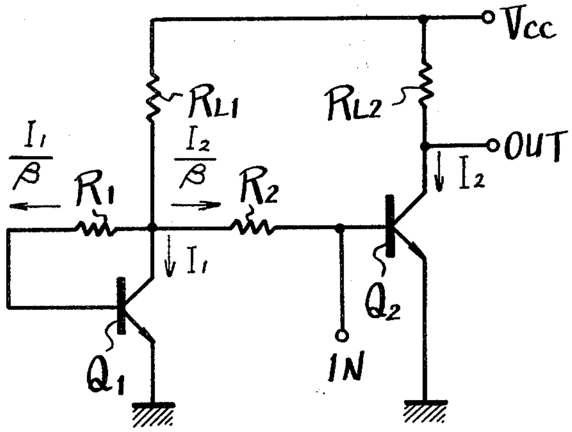
Fig. 1 (PRIOR ART)
FIG. 1 is a schematic of a prior art device wherein there is undesirable power loss of the biasing transistor and which provides an undesirable low input impedance.
Figure 2:
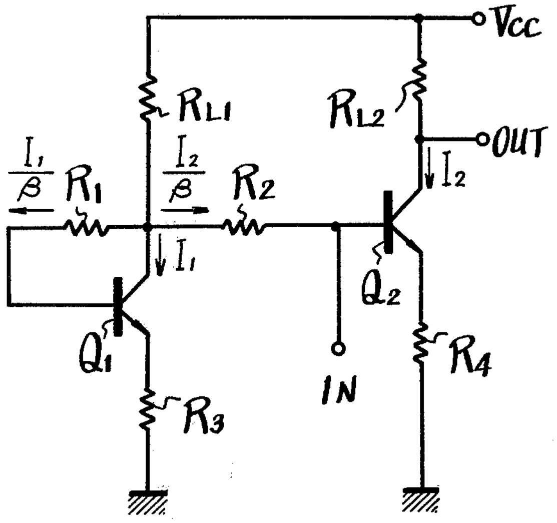
Fig. 2 (PRIOR ART)
FIG. 2 is a schematic of a prior art device similar to FIG. 1, wherein emitter resistors are also provided. This arrangement has also an undesirably low input impedance.
Figure 3:
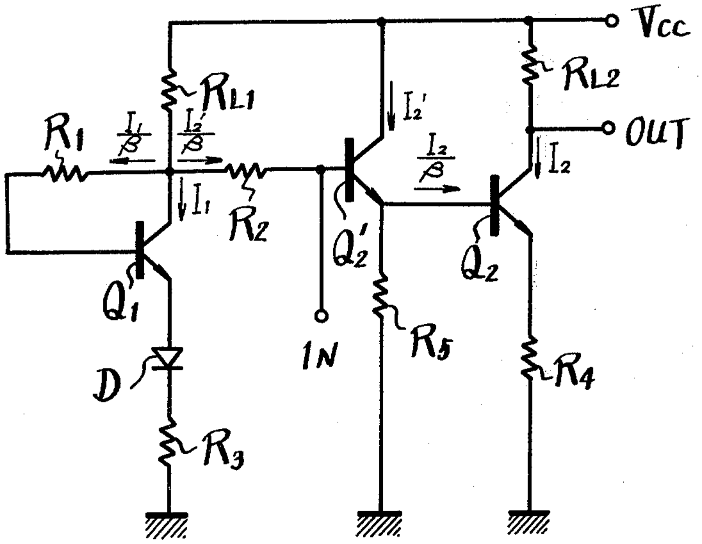
FIG. 3 is a schematic of a device according to the present invention showing the use of an emitter follower transistor to increase the input impedance of the amplifier.

Referring to FIG. 3 in detail, transistors $Q_2$ and $Q_1$ are provided to form an amplifier and a biasing circuit for the amplifier respectively as in the prior art FIGS. 1 and 2. In this circuit, an additional transistor of the emitter follower type, $Q_2'$ is also provided at the input of the transistor $Q_2$ so as to increase the input impedance of the amplifier. The base and the emitter of the emitter follower transistor $Q_2'$ are connected to a signal input terminal "in," and the base of the transistor $Q_2$ respectively. Further, in order to compensate for changes in current flowing through the transistors $Q_2$ and $Q_2'$ due to temperature variations caused by the addition of the transistor $Q_2'$, a diode D is connected in series with the emitter of the biasing transistor $Q_1$. The diode D produces a voltage drop of $V_{BE}$ across its anode and cathode. Resistance values $R_1$, $R_2$, $R_3$, $R_4$ and $R_5$ are selected to satisfy the following relations: $R_1/R_2 = K_1'' > 1$, $R_3/R_4 = K_2'' > 1$, $R_3/R_5 = K_3''$.

In operation, input signals to be amplified are applied to the input terminal at the base of the transistor $Q_2'$ and supplied to the base of the transistor $Q_2$ through the emitter follower transistor $Q_2'$. The quiescent collector currents $I_1$, $I_2$ and $I_2'$ of the transistors $Q_1$, $Q_2$ and $Q_2'$ have the following interrelations: $I_1 = 1/K_2'' \cdot I_2 = 1/K_1'' \cdot I_2'$. That is, the collector current $I_1$ of the biasing transistor $Q_1$ is $1/K_2''$ times smaller than the collector current $I_2$ of the transistor $Q_2$ and also $1/K_1''$ times smaller than the collector current $I_2'$ of the transistor $Q_2'$, so that the power dissipation incurred in the biasing portion is less than the Prior Art of FIG. 1. The quiescent collector current $I_1$ is not affected by changes in the transistor characteristics due to temperature variations and therefore, stabilized biasing of the transistors $Q_2$ and $Q_2'$ is obtained.

Examples of values of the elements used in FIG. 3 are as follows:

One Example $R_1 = 4k\Omega$
$R_2 = 2k\Omega$
$R_3 = 150\Omega$
$R_4 = 50\Omega$
$R_5 = 450\Omega$
$R_{L1} = 8.3k\Omega$
$V_{CC} = 10$ v
$V_{BE} = 0.75$ v
$\beta \approx 100$ The relationship of $I_1$ to $I_2$ and the independence of $I_1$ and $I_2$ from temperature variation are shown by equation (10) and (12). As follows:

$$\frac{R_1}{R_2} = K_1' > 1$$

$$\frac{R_3}{R_1} = K_2' > 1$$

$$\frac{R_3}{R_5} = K_3'$$

$\beta$ = current gain of $Q_1$, $Q_2$ and $Q_2'$ ($\beta >> 1$)

$$V_{CC} = R_{L1}\left(I_1 + \frac{I_1}{\beta} + \frac{I_2'}{\beta}\right) + R_1 \cdot \frac{I_1}{\beta} + 2V_{BE} + R_3 \cdot \left(I_1 + \frac{I_1}{\beta}\right) \quad (7)$$

$$V_{CC} = R_{L1} \cdot \left(I_1 + \frac{I_1}{\beta} + \frac{I_2'}{\beta}\right) + R_2 \cdot \frac{I_2'}{\beta} + 2V_{BE} + R_4 \cdot \left(I_2 + \frac{I_2}{\beta}\right) \quad (8)$$

(7) − (8)

$$R_1 \cdot \frac{I_1}{\beta} + R_3 \left(I_1 + \frac{I_1}{\beta}\right) = R_2 \cdot \frac{I_2'}{\beta} + R_4 \cdot \left(I_2 + \frac{I_2}{\beta}\right) \quad (9)$$

$$R_3\left(1 + \frac{1}{\beta}\right) \cdot I_1 = R_4 \cdot \left(1 + \frac{1}{\beta}\right) I_2 + R_2 \cdot \frac{I_2'}{\beta} - R_1 \cdot \frac{I_1}{\beta}$$

where, $\beta >> 1$, therefore, $$R_3 \cdot I_1 = R_4 \cdot I_2 + R_2 \cdot \frac{I_2'}{\beta} \quad R_1 \cdot \frac{I_1}{\beta}$$

$$I_2 \doteqdot \frac{R_3}{R_4} I_1 - \frac{R_2}{R_4} \cdot \frac{I_2'}{\beta} + \frac{R_1}{R_4} \cdot \frac{I_1}{\beta}$$

further, for $$\frac{R_3}{R_4} = K_2', \quad \frac{R_2}{R_4} \cdot \frac{I_2'}{\beta} << I_2$$

and $$\frac{R_1}{R_4} \cdot \frac{I_1}{\beta} << I_2$$

$$I_2 \doteqdot K_2' \cdot I_1$$

$$I_1 \doteqdot \frac{1}{K_2'} I_2 \quad (10)$$

By substituting $I_2$ for $K'_2 \cdot I_1$, Expression (9) becomes as follows:

$$R_1 \cdot \frac{I_1}{\beta} + R_3 \cdot \left(I_1 + \frac{I_1}{\beta}\right) = R_2 \cdot \frac{I_2'}{\beta} + R_4 \cdot \left(1 + \frac{1}{\beta}\right) \cdot K_2' \cdot I_1$$

$$R_1 \cdot \frac{I_1}{\beta} + R_3 \cdot \left(1 + \frac{1}{\beta}\right) I_1 = R_2 \cdot \frac{I_2'}{\beta} + R_4 \cdot \left(1 + \frac{1}{\beta}\right) \cdot K_2' \cdot I_1$$

where $\beta >> 1$ and $$K_2' = \frac{R_3}{R_4},$$

therefore, $$R_1 \cdot \frac{I_1}{\beta} + R_3 \cdot I_1 \doteqdot R_1 \cdot \frac{I_2'}{\beta} + R_3 \cdot I_1$$

$$I_1 \doteqdot \frac{R_2}{R_1} I_2'$$

$$\doteqdot \frac{1}{K_1'} I_2' \quad (11)$$

Now, base currents $$\frac{I_1}{\beta}, \frac{I_2}{\beta}$$

and $$\frac{I_2'}{\beta}$$

are negligible as compared with respective collector currents $I_1$, $I_2$ and $I'_2$ in actual operation.

Accordingly, expression (7) substantially becomes as follows:

$$V_{CC} \doteqdot R_{L1} \cdot I_1 + 2V_{BE} + R_3 \cdot I_1$$

$$I_1 \doteqdot \frac{V_{CC} - 2V_{BE}}{R_{L1} + R_3}$$

therefore, for $V_{CC} >> 2V_{BE}$, $$I_1 \doteqdot \frac{V_{CC}}{R_{L1} + R_3} \quad (11a)$$

Equation (11*a*) shows that $I_1$ is independent of $V_{BE}$.

Figure 4:
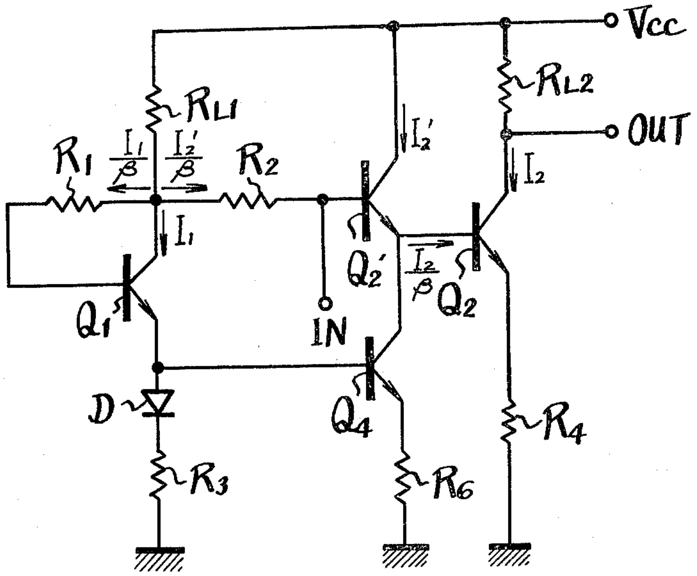
FIG. 4 is a schematic of a further embodiment of the invention using a fourth transistor to act as a current sink to improve the efficiency of supplying the input signal through the emitter follower transistor to an amplifying transistor.

FIG. 4 is similar to FIG. 3 where a fourth transistor $Q_4$ is provided with its collector connected to the emitter of the transistor $Q'_2$, its emitter connected to ground through a resistor R6 of relatively small resistance value and its base connected to a junction point between the emitter of the transistor $Q_1$ and the diode D. All other elements are arranged in the same manner as the circuit of embodiment 1.

This fourth transistor $Q_4$ operates as a constant current sink with the base biasing voltage maintaining the voltage difference between its base and emitter substantially constant, which biasing voltage is produced at the anode of the diode D and supplied therefrom.

In the circuit of FIG. 3, the resistor $R_5$ is in parallel with the effective input impedance of the transistor $Q_2$, and therefore the input signal is supplied to the base of the transistor $Q_2$ with a loss due to the presence of $R_5$. The efficiency in supply of the input signal is reduced, especially in the case where the resistance $R_5$ is selected to be close to or less than the value of the input impedance of the transistor $Q_2$. On the contrary, the current sink composed of the transistor $Q_4$ of this circuit can be considered to have a substantially infinite impedance to the input signal supplied to the transistor $Q_2$ to be amplified therein, so that the input signal can be supplied effectively to the base of the transistor $Q_2$ without loss.

Figure 5:
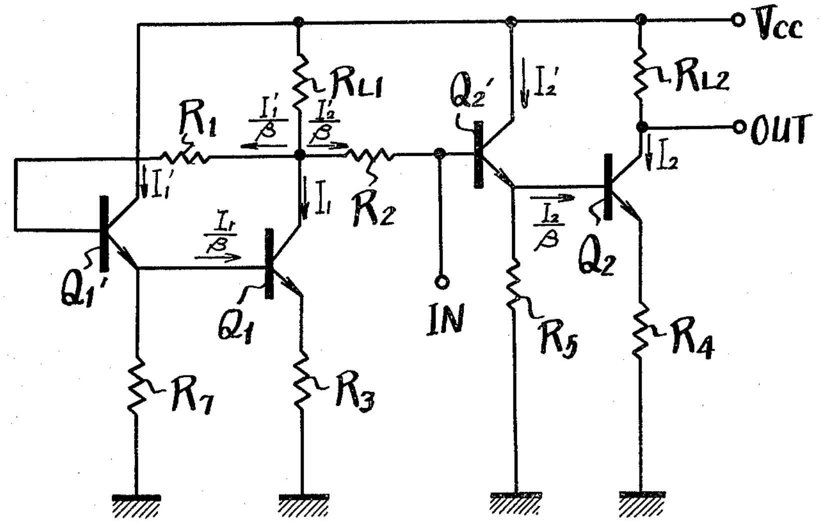
FIG. 5 is a schematic of an embodiment of the invention wherein a transistor $Q_1$ is used as a temperature compensating device.

Also, in this circuit, the quiescent collector currents $I_1$, $I_2$ and $I_2'$ of the transistors $Q_1$, $Q_2$ and $Q_2'$ are present with the same interrelations as the circuit of FIG. 3. Typical values are given by the following:

$R_1 = 4k\Omega$
$R_2 = 2k\Omega$
$R_3 = 150\Omega$
$R_4 = 50\Omega$
$R_6 = 75\Omega$
$R_{L1} = 8.3k\Omega$
$V_{CC} = 10$ v
$V_{BE} = 0.75$ v
$\beta \approx 100$ Referring to FIG. 5, an additional biasing transistor $Q_1'$ is connected to the biasing transistor $Q_1$ with its base-emitter path connected between the collector and base of the transistor $Q_1$ through the resistance value $R_1$. The emitter of the transistor $Q_1'$ is also connected to the ground through a resistor of resistance value $R_7$ and the collector of the transistor $Q_1'$ is connected to the voltage source. This provides temperature compensation similar to that provided by diode D of FIGS. 3 and 4.

In this case also the current of the biasing portion, that is, the sum of the currents flowing through the transistors $Q_1$ and $Q_1'$, is smaller than the quiescent current flowing through the amplifier portion and therefore, the undesirable power dissipation in the biasing portion is reduced. Further, the stabilized biasing for the amplifier portion is obtained in the same manner as the circuits of FIGS. 3 and 4.

The equations which apply to FIG. 5 are as follows:

$$\frac{R_1}{R_2} = \frac{R_7}{R_5} = K_1'' > 1$$

-Continued $$\frac{R_1}{R_7} = \frac{R_2}{R_5} = K_2'' > 1$$

$$\frac{R_3}{R_4} = K_3'' > 1$$

$\beta$ = current gain of $Q_1$, $Q_2$ and $Q_2'$ ($\beta >> 1$)

$$V_{CC} = R_{L1}\cdot\left(I_1 + \frac{I_1'}{\beta} + \frac{I_2'}{\beta}\right) + R_1\cdot\frac{I_1'}{\beta} + V_{BE} + R_7\cdot\left(I_1' + \frac{I_1'}{\beta}\right) \quad (12)$$

$$V_{CC} = R_{L1}\cdot\left(I_1 + \frac{I_1'}{\beta} + \frac{I_2'}{\beta}\right) + R_2\cdot\frac{I_2'}{\beta} + V_{BE} + R_5\cdot\left(I_2' + \frac{I_2'}{\beta}\right) \quad (13)$$

$$V_{CC} = R_{L1}\cdot\left(I_1 + \frac{I_1'}{\beta} + \frac{I_2'}{\beta}\right) + R_1\cdot\frac{I_1'}{\beta} = 2V_{BE} + R_3\cdot\left(I_1 + \frac{I_1}{\beta}\right) \quad (14)$$

$$V_{CC} = R_{L1}\cdot\left(I_1 + \frac{I_1'}{\beta} + \frac{I_2'}{\beta}\right) + R_2\cdot\frac{I_2'}{\beta} + 2V_{BE} + R_4\cdot\left(I_2 + \frac{I_2}{\beta}\right) \quad (15)$$

(12) − (13)

$$R_1\cdot\frac{I_1'}{\beta} + R_7\cdot\left(I_1' + \frac{I_1'}{\beta}\right) = R_2\cdot\frac{I_2'}{\beta} + R_5\cdot\left(I_2' + \frac{I_2'}{\beta}\right)$$

$$\frac{I_2'}{I_1'} = \frac{R_1 + R_7(1+\beta)}{R_2 + R_5(1+\beta)} = \frac{R_7}{R_5}\cdot\frac{\frac{R_1}{R_7} + (1+\beta)}{\frac{R_2}{R_5} + (1+\beta)}$$

where, $$\frac{R_1}{R_7} = \frac{R_2}{R_5} = K_2''$$

and $$\frac{R_7}{R_5} = K_1''$$

therefore, $$\frac{I_1'{}_2}{I_1'} = K_2''$$

$$I_1' = \frac{1}{K_1''}\cdot I_2' \quad (16)$$

(14) − (15)

$$R_1\cdot\frac{I_1'}{\beta} + R_3\cdot\left(I_1 + \frac{I_1}{\beta}\right) = R_2\cdot\frac{I_2'}{\beta} + R_4\cdot\left(I_2 + \frac{I_2}{\beta}\right) \quad (17)$$

By substituting $I'_1$ for $$\frac{1}{K_1''}\cdot I_2' = \frac{R_2}{R_1}\cdot I_2',$$

expression (17) becomes as follows:

$$R_2\cdot\frac{I_2'}{\beta} + R_3\cdot\left(I_1 + \frac{I_1}{\beta}\right) = R_2\cdot\frac{I_2'}{\beta} + R_4\cdot\left(I_2 + \frac{I_2}{\beta}\right)$$

-Continued $$\frac{I_2}{I_1} = \frac{R_3}{R_4} = K_3''$$

$$I_1 = \frac{1}{K_3''} I_2 \qquad (18)$$

Now, base currents $$\frac{I_1}{\beta}, \frac{I_2}{\beta}, \frac{I_1''}{\beta}$$

and $$\frac{I_2'}{\beta}$$

are negligible as compared with the respective collector currents $I_1$, $I_2$, $I'_1$ and $I'_2$ in actual operation.

Accordingly, expressions (12), (13) and (14) substantially become as follows:

$$V_{CC} \doteqdot R_{L1} \cdot I_1 + V_{BE} + R_7 \cdot I'_1 \qquad (19)$$

$$V_{CC} \doteqdot R_{L1} \cdot I_1 + 2V_{BE} + R_3 \cdot I_1 \qquad (20)$$

From (20)

$$I_1 (R_{L1} + R_3) \doteqdot V_{CC} - 2V_{BE}$$

therefore, for $V_{CC} >> 2V_{BE}$ $$I_1 \doteqdot \frac{V_{CC}}{R_{L1} + R_3} \qquad (20a)$$

further, from (19)

$$I_1' \doteqdot \frac{V_{CC} - V_{BE}}{R_7} - \frac{R_{L1}}{R_7} I_1$$

for $V_{CC} >> V_{BE}$, $$I_1' \doteqdot \frac{V_{CC}}{R_7} - \frac{R_{L1}}{R_7} I_1 \qquad (21)$$

by substituting $I_1$ for $$\frac{V_{CC}}{R_{L1} + R_3},$$

expression (21) becomes as follows:

$$I_1' \doteqdot \frac{V_{CC}}{R_7} - \frac{R_{L1}}{R_7} \cdot \frac{V_{CC}}{R_{L1} + R_3} = \frac{R_3}{R_7(R_{L1} + R_3)} \cdot V_{CC}$$

Equation (16) shows that $I'_1$ is a constant times smaller than $I'_2$ and equation (18) shows that $I_1$ is a constant times smaller than $I_2$, and equation (20*a*) shows that $I_1$ is independent of $V_{BE}$.

It will be apparent to those skilled in the art that many variations and modifications may be made without departing from the spirit and scope of the novel concepts of this invention.

We claim as our invention:

1. A transistor amplifier circuit comprising:

a first transistor;

a second transistor connected for supplying current bias to the first transistor;

the second transistor having its collector direct current connected to its base through a first resistor;

a third transistor connected in the emitter follower configuration;

a second resistor direct current connected between the collector of the second transistor and the base of said third transistor;

said third transistor being coupled between said second resistor and said first transistor, the ratio of the first resistor to the second resistor being greater than one, the emitters of the first and second transistors being provided with third and fourth resistors, respectively, the ratio of the third resistor to the fourth resistor being greater than one, and a P-N junction device connected in series with the base-emitter path of said second transistor.

2. A transistor amplifier circuit in accordance with claim 1, wherein said P-N junction comprises a diode coupled in series with the emitter of said second transistor.

3. A transistor amplifier circuit in accordance with claim 1, wherein said P-N junction comprises a fourth transistor having its output connected in parallel with the output of the second transistor, its base coupled to the collector of the second transistor, and its emitter coupled to the base of the second transistor.

4. A transistor amplifier circuit in accordance with claim 2, further comprising a fourth transistor having its output terminals coupled in series with the output of said third transistor and its base coupled to a point between said diode and the emitter of said second transistor, whereby said fourth transistor acts as a constant current sink for said third transistor to improve the efficiency of supplying the input signal through said third transistor to the input of said first transistor.

* * * * *